US009507192B2

(12) United States Patent
Lim et al.

(10) Patent No.: US 9,507,192 B2
(45) Date of Patent: Nov. 29, 2016

(54) DISPLAY DEVICE HAVING COVER WINDOW

(71) Applicant: SAMSUNG DISPLAY CO., LTD., Yongin, Gyeonggi-Do (KR)

(72) Inventors: Sang-Hyun Lim, Yongin (KR); Jun-Ho Kwack, Yongin (KR)

(73) Assignee: Samsung Display Co., Ltd., Yongin-si (KR)

( * ) Notice: Subject to any disclaimer, the term of this patent is extended or adjusted under 35 U.S.C. 154(b) by 424 days.

(21) Appl. No.: 14/026,824

(22) Filed: Sep. 13, 2013

(65) Prior Publication Data

US 2014/0198436 A1 Jul. 17, 2014

(30) Foreign Application Priority Data

Jan. 15, 2013 (KR) ........................ 10-2013-0004593

(51) Int. Cl.
*F21V 3/00* (2015.01)
*G02F 1/1333* (2006.01)
*G06F 1/16* (2006.01)
*H04M 1/02* (2006.01)
*H01L 51/52* (2006.01)

(52) U.S. Cl.
CPC ....... *G02F 1/133308* (2013.01); *G06F 1/1601* (2013.01); *G06F 1/1637* (2013.01); *H01L 51/5237* (2013.01); *H04M 1/0266* (2013.01); *G02F 2001/13332* (2013.01); *G02F 2001/133331* (2013.01); *G02F 2202/28* (2013.01); *G06F 2200/1612* (2013.01)

(58) Field of Classification Search
CPC ... G02F 1/13308; H05K 5/03; G06F 1/1637; H04M 1/0266
USPC .......... 362/311.06, 311.08, 311.15; 313/511; 455/550.1
See application file for complete search history.

(56) References Cited

U.S. PATENT DOCUMENTS

| 2011/0050657 | A1* | 3/2011 | Yamada ............. H01L 27/3293 345/204 |
| 2011/0285934 | A1* | 11/2011 | Watanabe ......... G02F 1/133526 349/58 |
| 2013/0002133 | A1 | 1/2013 | Jin et al. |
| 2013/0002583 | A1 | 1/2013 | Jin et al. |

FOREIGN PATENT DOCUMENTS

| KR | 10-2011-0068661 | 6/2011 |
| KR | 10-2012-0036633 | 4/2012 |
| KR | 10-2012-0046427 | 5/2012 |
| KR | 10-2012-0054541 | 5/2012 |

OTHER PUBLICATIONS

EPO Search Report dated Apr. 3, 2014, for corresponding European Patent application 13196939.6, (6 pages).

* cited by examiner

*Primary Examiner* — Anh Mai
*Assistant Examiner* — Matthew Peerce
(74) *Attorney, Agent, or Firm* — Lewis Roca Rothgerber Christie LLP

(57) ABSTRACT

A display device includes a cover window having curves at one or more outer blocks of the cover window, an outside and an inside of the cover window each having a shape of a quadrisected arc of an ellipse and together forming a lens, and a thickness of the cover window at one of the outer blocks being thicker than a thickness of the cover window at a center of the cover window; and a display panel attached to the inside of the cover window.

16 Claims, 6 Drawing Sheets

DISPLAY DEVICE HAVING COVER WINDOW

CROSS-REFERENCE TO RELATED APPLICATION

This application claims priority to and the benefit of Korean Patent Application No. 10-2013-0004593 filed in the Korean Intellectual Property Office on Jan. 15, 2013, the entire contents of which are incorporated herein by Reference.

BACKGROUND OF THE INVENTION (a) Field

Embodiments of the present invention relate to a display device and, more particularly, to a display device having a structure in which a cover window is attached to a display panel.

(b) Description of the Related Art

A common display device has a structure including a cover window adhered to the front of a display panel. In the adhesion structure of the display panel and the cover window, a dead space is generated, in addition to a display area that is actually driven, because the transparent cover window is coupled with the display area of the flat display panel and the outside edge of the display panel requires an area through which a driving wire passes. Thus, a minimum bezel area must be formed in the cover window so that the dead space is not exposed to the front. An area for coupling with a display device set is further necessary in the outer block of the display panel. That is, since an additional bezel area for coupling with the display device set is necessary in addition to the minimum bezel area for the driving wire, the bezel area must be present and thus the bezel area has a form to surround the display area externally when the display device is seen from the front.

In this conventional display device, the degree of freedom in the design of the display device is low because the bezel is always located in the outer block of the display device. Area use efficiency is also low because a ratio of the occupied display area is small in the entire width of the display device due to the unavailable bezel area, resulting in a problem in that the size of the display device set is increased.

The above information disclosed in this Background section is only for enhancement of understanding of the background of the invention and therefore it may contain information that does not form the prior art that is already known in this country to a person of ordinary skill in the art.

SUMMARY

Aspects of embodiments of the present invention are directed toward providing a display device including a cover window without a bezel. Additional aspects of the present invention are directed toward a display device being capable of representing a larger display area in a display device having the same size (or substantially the same size) and improving the degree of freedom in the design of the display device by configuring a cover window coupled with a display panel in outer blocks in a lens form in which curves are formed.

According to an exemplary embodiment of the present invention, a display device includes a cover window having curves at one or more outer blocks of the cover window, an outside and an inside of the cover window each having a shape of a quadrisected arc of an ellipse and together forming in a lens, and a thickness of the cover window at one of the outer blocks of the cover window being thicker than a thickness of the cover window at a center of the cover window; and a display panel attached to the inside of the cover window.

The degree of change in the curvature of a virtual ellipse corresponding to the outside of the cover window may be different from the degree of change in the curvature of a virtual ellipse corresponding to the inside of the cover window.

An angle formed by a plane, coupling a first end crossing a long axis of the virtual ellipse corresponding to the outside of the cover window and a second end crossing a long axis of the virtual ellipse corresponding to the inside of the cover window together, and a flat surface at the center of the cover window is a refractive threshold angle calculated according to a material of the cover window.

A plane coupling a center of a virtual ellipse corresponding to the outside of the cover window and a center of a virtual ellipse corresponding to the inside of the cover window together may be orthogonal to a flat surface at the center of the cover window.

A length of a long radius of a virtual ellipse corresponding to the outside of the cover window may be substantially identical to a length of a quadrisected arc of a virtual ellipse corresponding to the inside of the cover window.

A display area of the display panel may extend to the second end of the virtual ellipse corresponding to the inside of the cover window.

The cover window may include a glass, poly(methylmethacrylate) (PMMA), or polycarbonate (PC) material.

An end of the outer block of the cover window may include an inclined plane inclined relative to a flat surface at the center of the cover window.

The inclined plane may be inclined from a first end of the outside of the cover window, crossing a long axis of a virtual ellipse corresponding to the outside of the cover window, toward the inside of the cover window.

The inclined plane may have a slope such that the cover window covers an outer block of the display panel.

One of the outer blocks of the cover window may have a portion extending between the outside and the inside of the cover window in such a way as to be orthogonal to a flat surface at a center of the cover window.

A set apparatus may be attached at an inside of the cover window and at an end of one of the outer blocks of the cover window at a portion in which the display panel is not formed.

A set apparatus may be attached to an inside of one of the outer blocks of the cover window at a portion in which the display panel is not formed.

A set apparatus may be attached to the inclined plane.

The display panel may have curves formed in the outer blocks of the display panel along the inside of the cover window corresponding to a shape of the cover window.

The display panel may include an organic light-emitting display element.

The display panel may have a flexible characteristic.

In accordance with aspects of exemplary embodiments of the present invention, a display device without a bezel can be manufactured by configuring a cover window having one or more outer blocks in a lens form in which curves are formed coupled with a display panel.

Furthermore, according to aspects of embodiments of the present invention, the size of an apparatus can be reduced and the degree of freedom in the design of a display device can be improved because a larger display area can be represented in a display device having the same size (or substantially the same size).

BRIEF DESCRIPTION OF THE DRAWINGS

The accompanying drawings, together with the specification, illustrate exemplary embodiments of the present invention, and, together with the description, serve to explain the principles of the present invention.

DETAILED DESCRIPTION

Figure 1:
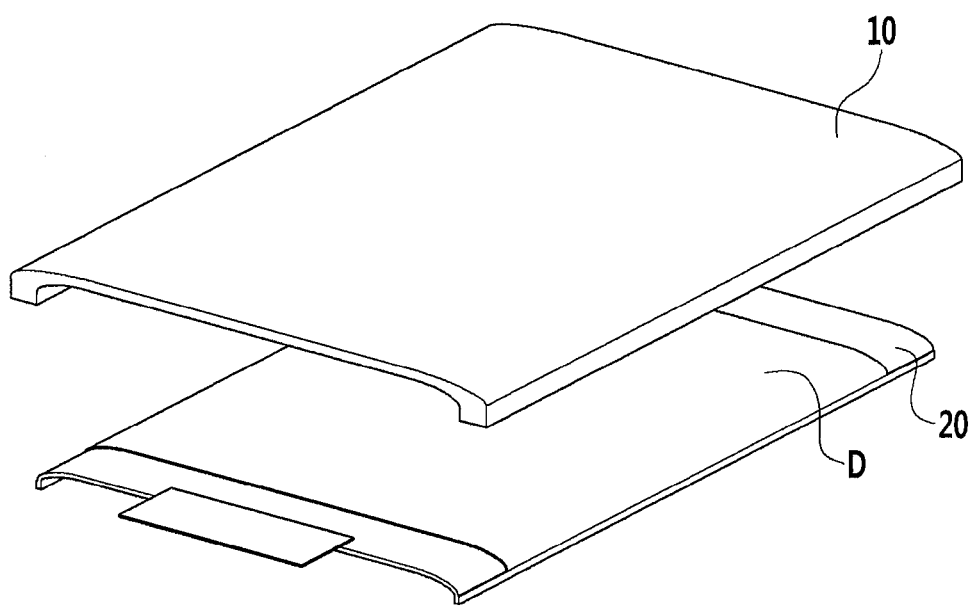
FIG. 1 is an exploded perspective view schematically showing a display device in accordance with an exemplary embodiment of the present invention.

Hereinafter, some exemplary embodiments of the present invention are described in detail with reference to the accompanying drawings in order for those skilled in the art to be able to readily implement the embodiments. As those skilled in the art would recognize, the present invention can be implemented in various ways and is not limited to the exemplary embodiments described herein.

Furthermore, in several exemplary embodiments, constituent elements having the same (or substantially the same) construction are assigned the same reference numerals and are described in connection with one exemplary embodiment as a representative example. In the remaining exemplary embodiments, only constituent elements different from those of the representative and exemplary embodiment are described.

It is to be noted that the drawings are illustrated as being schematic and are not illustrated in actual sizes. The relative dimensions and ratios of parts in the drawing may be illustrated as being enlarged or reduced in the sizes of the parts for clarity and convenience in the drawings, and specific dimensions are only illustrative, but not limitative.

Furthermore, the same (or substantially the same) structure, element, or part shown in two or more drawings is assigned the same reference numeral in order to indicate a similar characteristic. When it is said that any part is placed 'over' or 'on' another part, it may mean the corresponding part is placed directly over or directly on another part or a third part may be placed between the two pats.

An embodiment of the present invention illustrates one exemplary embodiment of the present invention in detail. As a result, it is expected that the illustration may be modified in various ways. Accordingly, the embodiment is not limited to a specific form of a shown area, and it may include a modification of a form according to fabrication, for example.

A display device in accordance with an exemplary embodiment of the present invention is described below with reference to FIGS. 1 to 4.

Figure 2:
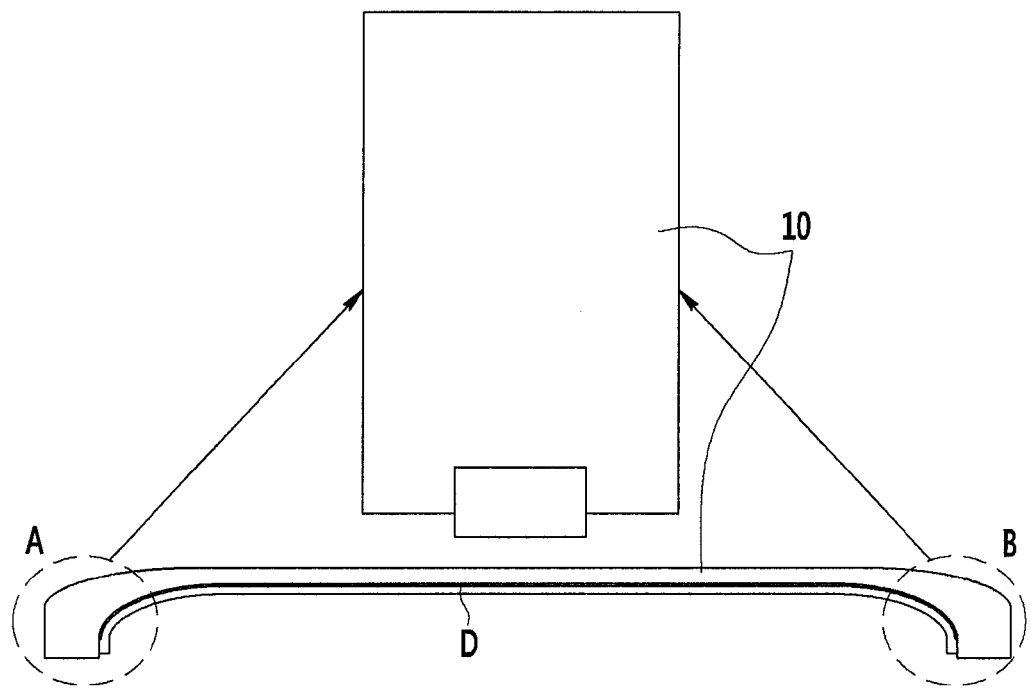
FIG. 2 is a plan view and a corresponding cross-sectional view schematically showing the display device in accordance with an exemplary embodiment of the present invention.

FIG. 1 is an exploded perspective view schematically showing a display device in accordance with an exemplary embodiment of the present invention, and FIG. 2 is a plan view and a corresponding cross-sectional view schematically showing the display device in accordance with an exemplary embodiment of the present invention.

Referring to FIGS. 1 and 2, the display device includes a cover window 10 and a display panel 20. The cover window 10 is provided outside the display device and can be made of a transparent material, such as tempered glass, poly (methylmethacrylate) (PMMA), or polycarbonate (PC) having high strength in order to prevent (or reduce the likelihood of) scratches from the outside. Curves are formed at one or more outer blocks of the cover window 10, and each of the outside and the inside of the cover window 10 can have a shape of a quadrisected arc of an ellipse.

The display panel 20 can be attached to the inside of the cover window 10.

The display panel 20 can have a flexible characteristic, and the display panel 20 can be an organic light-emitting display panel.

If the display panel 20 in accordance with an exemplary embodiment of the present invention is an organic light-emitting display panel, the display panel 20 can include a flexible substrate, a driving circuit unit and an organic light-emitting element formed over the flexible substrate, and a thin sealing film.

The flexible substrate can be made of a flexible plastic material, but the present invention is not limited thereto. For example, the flexible substrate can be a metallic substrate made of stainless steel or it can be made of a variety of flexible materials.

The flexible substrate can be made of a plastic material having an excellent heat-resisting property and durability, such as polyethylene terephthalate, polyethylene naphthalate, polycarbonate, polyarylate, polyetherimide, polyether sulfone, or polyimide.

Meanwhile, the display panel 20 can be attached to the inside of the cover window 10 by using, for example, a transparent adhesive, such as an Optically Clear Adhesive (OCA) film or UltraViolet (UV) resin.

The display panel 20 can have a flexible characteristic. The display panel 20 can be attached to the inside of the cover window 10 in a form in which curves are formed in the outer blocks of the display panel 20 along the inside of the display panel 20 to correspond to a shape of the cover window 10.

Although the curves are illustrated as being formed in both outer blocks A and B of the cover window 10 in FIGS.

1 and 2, the curve may be formed only in one of the outer blocks A and B of the cover window 10.

Figure 3:
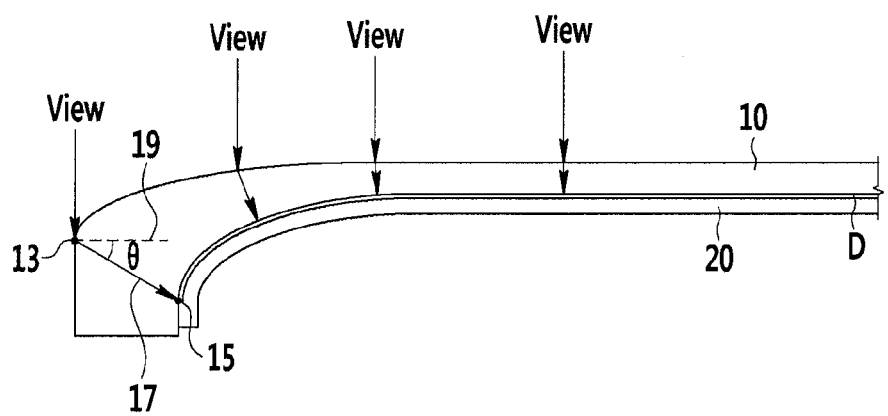
FIG. 3 is an enlarged cross-sectional view of a portion 'A' of the display device shown in FIG. 2 in accordance with an exemplary embodiment of the present invention.
Figure 4:
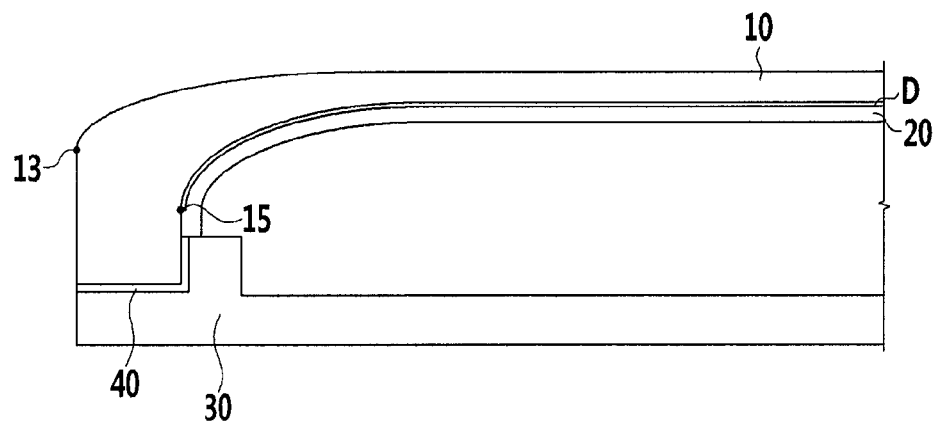
FIG. 4 is an enlarged cross-sectional view schematically showing the portion 'A' of the display device shown in FIG. 2 in a state in which the display device in accordance with an exemplary embodiment of the present invention is coupled with a set apparatus.

FIG. 3 is an enlarged cross-sectional view of a portion 'A' of the display device shown in FIG. 2 in accordance with an exemplary embodiment of the present invention, and FIG. 4 is a cross-sectional view schematically showing a state in which the display device in accordance with an exemplary embodiment of the present invention is coupled with a set apparatus.

Referring to FIG. 3, the cover window 10 can have the curve formed in the outer block thereof and, at the curve, the outside and the inside of the cover window 10 each have a shape of a quadrisected arc of an ellipse. The cover window 10 can have a form in which it is downward bent 90° in a lens form having a thickness thicker toward the outer block (e.g., a thickness of the cover window 10 at the outer block can be thicker than a thickness at a center of the cover window 10), while the outer block of the cover window 10 has a shape of a quadrisected arc of an ellipse.

The display panel 20 can be attached to the inside of the cover window 10. A quadrisected arc of one virtual ellipse can correspond to the outside of the cover window 10, and a quadrisected arc of another virtual ellipse can correspond to the inside of the cover window 10. Here, a degree of change in a curvature of the ellipse corresponding to the outside of the cover window 10 can be different from a degree of change in a curvature of the ellipse corresponding to the inside of the cover window 10. For example, the degree of change in the curvature of the ellipse corresponding to the outside of the cover window 10 can be smaller than the degree of change in the curvature of the ellipse corresponding to the inside of the cover window 10. The degree of change in the curvature refers to a difference in the curvature of a unit section in a virtual elliptical arc. That is, curvature can be determined at each specific point of the virtual elliptical arc, and a curvature difference between two points can be determined. In the display device in accordance with an exemplary embodiment of the present invention, this curvature difference can be greater at the inside of the cover window than at the outside of the cover window.

Meanwhile, the cover window 10 can support a plane 17 that couples a first end 13 crossing the long axis of the virtual ellipse corresponding to the outside of the cover window 10 and a second end 15 crossing the long axis of the virtual ellipse corresponding to the inside of the cover window 10 together. In FIG. 3, the long axis of each virtual ellipse is an axis in a horizontal direction, and the short axis of each virtual ellipse is an axis in a vertical direction orthogonal to the long axis. An angle formed by the plane and a flat surface of the cover window 10 is a refractive threshold angle according to a material of the cover window 10.

Meanwhile, the flat surface of the cover window 10 corresponds to a plane at the central part of the cover window 10 in which the curve is not formed. In FIG. 3, the plane 19 corresponds to the flat surface of the cover window 10.

The refractive threshold angle θ is an angle of incidence at which total reflection starts to occur when light is incident from a material having a high refractive index to a material having a small refractive index. As a difference between the densities of two materials, a difference between the refractive indices of the two materials increase, and an angle of incidence increases, the reflectance of light incident on a boundary between the two media having different densities increases in accordance with Snell's law. If the angle of incidence increases, the refractive index increases. An angle of refraction of a coarse (e.g., low density) medium having a low refractive index is greater than that of a dense medium having a low refractive index. When light travels from a dense medium to a coarse (e.g., low density) medium, an angle of incidence is gradually increased and until an angle of refraction becomes 90° at a particular angle of incidence. The angle of incidence at this time is called a refractive threshold angle θ. If light is incident at an angle greater than the refractive threshold angle θ, the light is 100% reflected from the boundary without a refractive component (e.g., total internal reflection).

The refractive threshold angle θ can be represented by a ratio of the refractive indices of the two materials in accordance with Snell's law. The ratio of the refractive indices of the two materials can be represented as in Equation 1 below.

$$\sin\theta = \frac{n_2}{n_1} \quad (1)$$

In Equation 1, θ is the refractive threshold angle, and $n_1$ and $n_2$ are the refractive indices of the two materials.

In the display device of FIG. 3 in accordance with an exemplary embodiment of the present invention, the cover window 10 can be made of a glass material, where the refractive index $n_{glass}$ of glass is 1.5. The refractive index $n_{air}$ of air is 1. Assuming that $n_1=n_{glass}$ and $n_2=n_{air}$, sin θ=1/1.5 and θ=arcsin (1/1.5) in accordance with Equation 1. As a result, the refractive threshold angle θ calculated in terms of an angle is about 41.81°.

Here, the display area D of the display panel 20 is formed up to a point that meets an extension line according to the refractive threshold angle θ (e.g., a line that extends along or from the refractive threshold angle θ. That is, the display area D is formed up to only the end 15 of the virtual ellipse corresponding to the inside of the cover window 10.

Refraction and total reflection can be generated according to an angle of incidence at the boundary of the glass medium and the air. At a portion of the display area D formed up to an angle greater than the refractive threshold angle θ of about 41.81°, observation of the portion of the display area D at an angle greater than the refractive threshold angle θ of about 41.81° from the front of the cover window 10 is impossible because of refraction (e.g., total internal reflection). Accordingly, if the display area D of the display device attached to the inside of the cover window 10 is fit (e.g., extended) to a point that meets the extension line of the refractive threshold angle θ, a screen can be displayed from the front of the cover window 10 without a bezel.

An image implemented from the display area D can be secured in a visual field of the front of the cover window 10 at an angle of the refractive threshold angle θ or lower. For example, an image displayed by the display area D can be viewed through the cover window 10, when the image is viewed at an angle that is less than or equal to the refractive threshold angle θ. If the display area D is formed at an angle of the refractive threshold angle θ or higher, a phenomenon in which an image is cut (e.g., truncated) may occur.

As shown in FIG. 4, the display device can be coupled with a set apparatus 30. The cover window 10 has the curve formed in the outer block thereof and includes the outside and the inside. The outer block of the cover window 10 is downward bent from the outside and the inside of the cover window 10 in such a way as to have an end orthogonal to the flat surface of the cover window 10.

The display panel 20 is attached to the inside of the cover window 10, and the set apparatus 30 can be attached to an inside in which the display panel 20 at the outer block of the cover window 10 is not formed by means of an adhesive 40.

Figure 5:
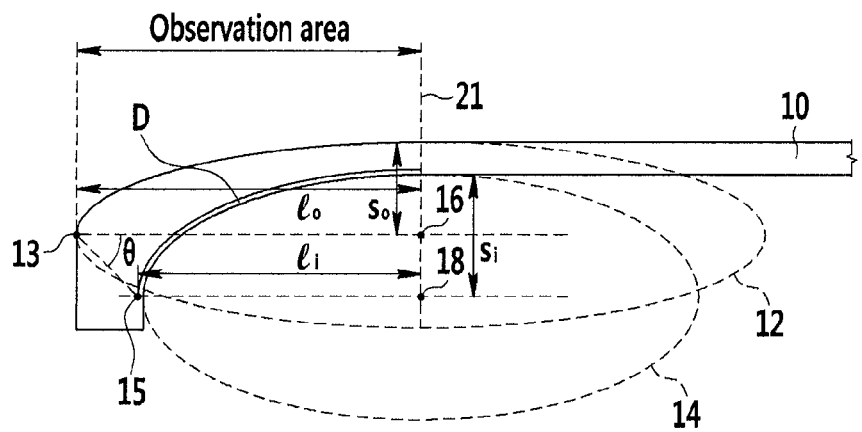
FIG. 5 is a cross-sectional diagram showing a portion of the structure of a cover window of the display device in accordance with an exemplary embodiment of the present invention.
Figure 6:
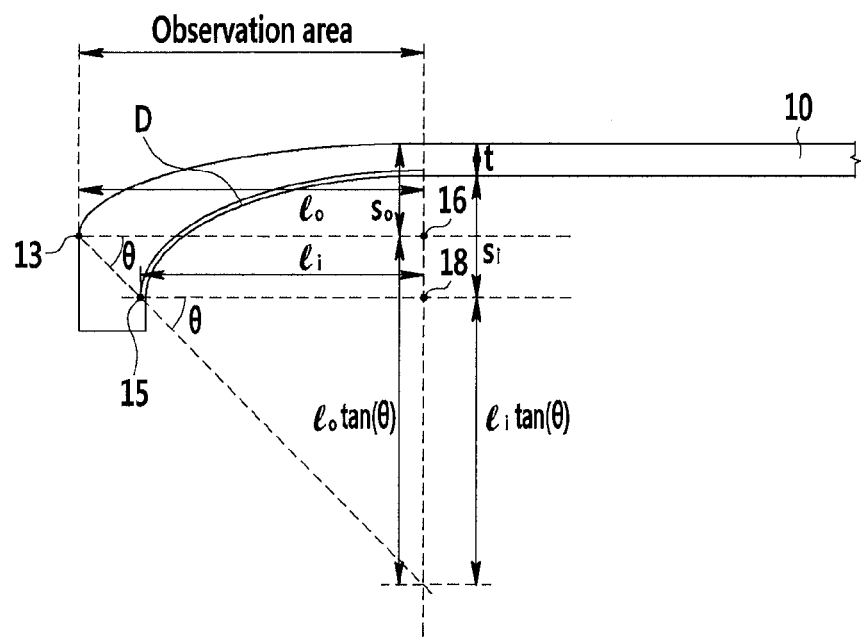
FIG. 6 is a cross-sectional diagram illustrating a method of calculating the curvature dimensions of the cover window structure of the display device in accordance with an exemplary embodiment of the present invention.

FIG. 5 is a diagram showing the structure of the cover window of the display device in accordance with an exemplary embodiment of the present invention, and FIG. 6 is a diagram illustrating a method of calculating the curvature dimensions of the cover window structure of the display device in accordance with an exemplary embodiment of the present invention.

Referring to FIG. 5, the display area D of the display panel 20 can be formed up to a point of the inside of the cover window 10 that meets the extension line of the refractive threshold angle θ at the outer block of the cover window 10. For example, if the cover window 10 forms the display area D only up to the second end 15 to cross the long axis of the virtual ellipse corresponding to the inside of the cover window 10, a visual field can be secured without a phenomenon in which an image implemented in the display area D is cut (e.g., truncated).

An observation area viewed by a user of the display area D in the outer block of the cover window 10 is an area corresponding to a length of a quadrisected arc of a virtual ellipse 14 corresponding to the inside of the cover window 10. Here, a long radius of a virtual ellipse 12 corresponding to the outside of the cover window 10 is the same (or substantially the same) as the length of the quadrisected arc of the virtual ellipse 14 corresponding to the inside of the cover window 10 (e.g., the length of the display area D). For example, the observation area of an image implemented in (or along) the display area D is recognized as the long radius $l_0$ of the virtual ellipse 12 corresponding to the outside of the cover window 10. Accordingly, the distortion of a display image can be minimized or reduced.

Furthermore, a plane 21, aligned along a center 16 of the virtual ellipse 12 corresponding to the outside of the cover window 10 and a center 18 of the virtual ellipse 14 corresponding to the inside of the cover window 10, can be formed to be orthogonal to the flat surface of the cover window 10. Accordingly, the distortion of a display image can also be minimized or reduced.

Referring to FIG. 6, a condition under which distortion of an image is minimized or reduced, for example, a condition under which the long radius $l_0$ of the virtual ellipse 12 corresponding to the outside of the cover window 10 is formed to be the same (or substantially the same) as the length of the quadrisected arc of the virtual ellipse 14 corresponding to the inside of the cover window 10, can be represented as in Equation 2 below.

$$l_0 = \frac{\pi}{2}\sqrt{\frac{l_i^2 + s_i^2}{2}} \quad (2)$$

In Equation 2, $l_0$ is a long radius of the virtual ellipse 12 corresponding to the outside of the cover window 10, $l_i$ is a long radius of the virtual ellipse 14 corresponding to the inside of the cover window 10, and $s_i$ is a short radius of the virtual ellipse 14 corresponding to the inside of the cover window 10.

Meanwhile, Equation 3 below is a relation equation obtained by a triangular function of dimensions shown in FIG. 6.

$$s_0 + l_0 \tan(41.81°) = t + s_i + l_i \tan(41.81°) \quad (3)$$

In Equation 3, t is a thickness at the flat surface of the cover window 10, and $s_0$ is a short radius of the virtual ellipse 12 corresponding to the outside of the cover window 10.

Equations 2 and 3 can be summarized into Equations 4 and 5 below.

$$s_i = s_0 + l_0\tan(41.81°) - t - \sqrt{\left(\frac{2l_0}{\pi}\right)^2 - s_i^2}\,\tan(41.81°) \quad (4)$$

$$l_0 = \frac{s_0 + l_0\tan(41.81°) - t - \sqrt{\left(\frac{2l_0}{\pi}\right)^2 - l_i^2}}{\tan(41.81°)} \quad (5)$$

For example, if the long radius $l_0$ and the short radius $s_0$ of the virtual ellipse 12 corresponding to the outside of the cover window 10 and the thickness t at the flat surface of the cover window 10 are given (e.g., selected), the long radius $l_i$ and the short radius $s_i$ of the virtual ellipse corresponding to the inside of the cover window 10 can be calculated in accordance with Equations 2 and 3.

In contrast, if the long radius $l_i$ and the short radius $s_i$ of the virtual ellipse 14 corresponding to the inside of the cover window 10 and the thickness t at the flat surface of the cover window 10 are given (e.g., selected), the long radius $l_0$ and the short radius $s_o$ of the virtual ellipse 12 corresponding to the outside of the cover window 10 can be calculated in accordance with Equations 2 and 3.

Since an angle of 41.81° in Equations 2 to 5 is the refractive threshold angle θ calculated using a ratio of the refractive indices of air and glass, the refractive threshold angle θ can be calculated to be a different angle when a different material (e.g., a material different from glass) is used for the cover window 10. For example, if the cover window 10 is made of a poly(methylmethacrylate) (PMMA) material, the refractive threshold angle θ is about 42.16°, because poly(methylmethacrylate) has a refractive index of about 1.492. If the cover window 10 is made of a polycarbonate (PC) material, the refractive threshold angle θ is about 39.09°, because polycarbonate (PC) has a refractive index of about 1.58.

Figure 7:
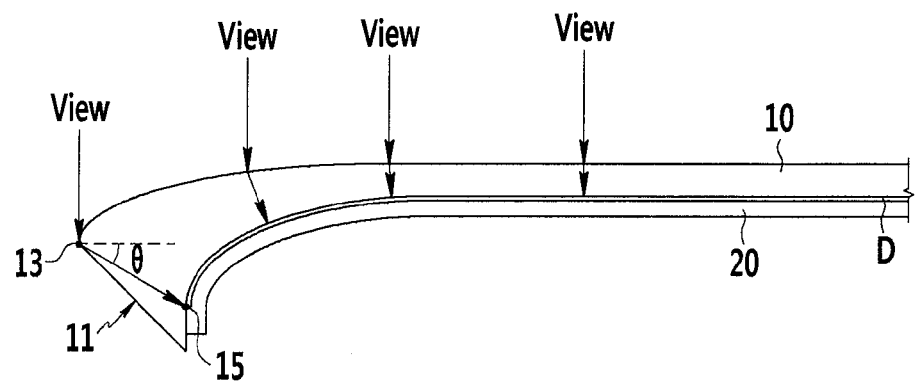
FIG. 7 is a cross-sectional view schematically showing a portion of a display device in accordance with another exemplary embodiment of the present invention.
Figure 8:
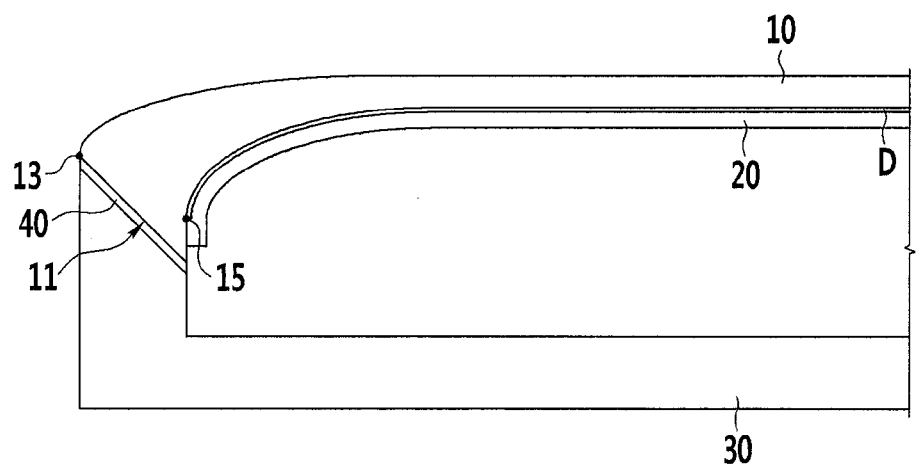
FIG. 8 is a cross-sectional view schematically showing a state in which the display device in accordance with another exemplary embodiment of the present invention is coupled with a set apparatus.

FIG. 7 is a cross-sectional view schematically showing a display device in accordance with another exemplary embodiment of the present invention, and FIG. 8 is a cross-sectional view schematically showing a state in which the display device in accordance with another exemplary embodiment of the present invention is coupled with a set apparatus.

Referring to FIGS. 7 and 8, an end of the outer block of a cover window 10 includes an inclined plane in an inclined form relative to the flat surface of the cover window 10. Furthermore, the inclined plane can have an inclined form to the flat surface of the cover window 10 from a first end 13 at which the cover window 10 crosses the long axis of a virtual ellipse corresponding to the outside of the cover window 10 toward the inside of the cover window 10.

Furthermore, the inclined plane can have a slope in which the cover window 10 covers the outer block of a display panel 20. That is, the cover window 10 can have an inclined form so that an end of the display panel 20 is not exposed from the first end 13 crossing the long axis of the virtual ellipse corresponding to the outside of the cover window 10 toward the inside of the cover window 10.

Even in the present exemplary embodiment, the cover window 10 can be made of a glass material and, in that embodiment, the refractive threshold angle θ is assumed to be 41.81°. The structure of the display device in accordance with the present exemplary embodiment is the same (or substantially the same) as that of the display device shown in FIGS. 3 to 6 except that the end of the outer block of the cover window 10 has an inclined form, and thus a redundant description of those features already described is omitted here. The outside of the end of the outer block of the cover window 10 becomes an adhesive surface 11 (e.g., the inclined plane can have an adhesive thereon), and a set apparatus 30 can be attached to the outside of the end of the outer block of the cover window 10 by way of an adhesive 40, as shown in FIG. 8.

Figure 9:
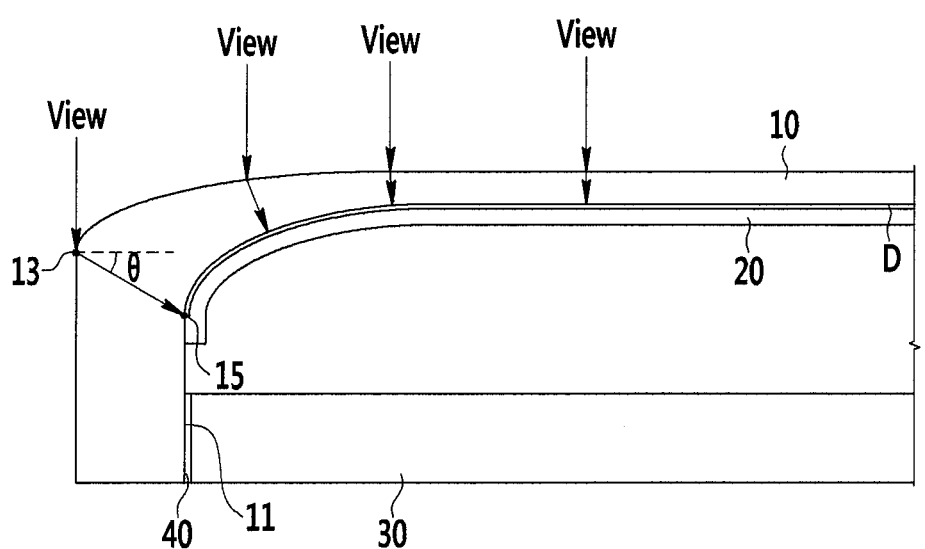
FIG. 9 is a cross-sectional view schematically showing a state in which a display device in accordance with yet another exemplary embodiment of the present invention is coupled with a set apparatus.

FIG. 9 is a cross-sectional view schematically showing a state in which a display device in accordance with yet another exemplary embodiment of the present invention is coupled with a set apparatus.

Referring to FIG. 9, the outer block of a cover window 10 can have a form in which the outer block of the cover window 10 is lengthily extended (e.g., further extended) in such a way as to be orthogonal to the flat surface of the cover window 10 from the outside and the inside of the cover window 10. If the lengthily extended portion is used, the inside of the cover window 10 can be used as an adhesive surface 11 having an increased area and the outside of the cover window 10 can be used as the side of a set device.

Even in the present exemplary embodiment, the cover window 10 can be made of a glass material and, in that embodiment, the refractive threshold angle θ is assumed to be 41.81°. The structure of the display device in accordance with the present exemplary embodiment is the same (or substantially the same) as that of the display device shown in FIGS. 3 to 6 except that the end of the outer block of the cover window 10 has the lengthily extended form, and thus a redundant description of those features already described is omitted here.

In this embodiment, the inside of the outer block of the cover window 10 becomes the adhesive surface 11, and a set apparatus 30 can be attached to an inside of the outer block of the cover window 10 in which the display panel 20 is not formed by way of an adhesive 40. The set apparatus 30 can be attached to the inside (e.g., only the inside) of the outer block of the cover window 10, and the outside of the outer block of the cover window 10 can be used as the side of a set device.

As described above, in accordance with the display device according to the exemplary embodiments of the present invention, the cover window coupled with the display panel is configured in a lens form in which a curve or curves are formed in the outer blocks of the cover window or one of the outer blocks of the cover window. Accordingly, an effect in which a bezel has been removed or can be omitted can be obtained, the size of an apparatus can be reduced because a larger display area can be represented in a display device having the same size (or substantially the same size), and the degree of freedom in the design of the display device can be improved.

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims, and equivalents thereof.

<Description of some of the symbols>

10: cover window
11: adhesive surface
12: virtual ellipse corresponding to the outside of a cover window
14: virtual ellipse corresponding to the inside of the cover window
13: first end
15: second end
16: center of a virtual ellipse corresponding to the outside of the cover window
17: plane coupling the first end to the second end
18: center of the virtual ellipse corresponding to the inside of the cover window
19: plane corresponding to a flat surface at a center of the cover window
20: display panel
21: plane aligned along the centers of the virtual ellipses
30: set apparatus
40: adhesive
D: display area
θ: refractive threshold angle
$l_0$: long radius of the virtual ellipse corresponding to the outside of the cover window
$s_0$: short radius of the virtual ellipse corresponding to the outside of the cover window
$l_i$: long radius of the virtual ellipse corresponding to the inside of the cover window
$s_i$: short radius of the virtual ellipse corresponding to the inside of the cover window

What is claimed is:

1. A display device comprising:
a cover window having curves at one or more outer blocks of the cover window, an outside and an inside of the cover window each having a shape of a quadrisected arc of a virtual ellipse and together forming a lens, and a thickness of the cover window at one of the outer blocks of the cover window being thicker than a thickness of the cover window at a center of the cover window; and
a display panel attached to the inside of the cover window,
wherein a length of a long radius of the virtual ellipse corresponding to the outside of the cover window is identical to a length of a quadrisected arc of the virtual ellipse corresponding to the inside of the cover window.

2. The display device of claim 1, wherein a degree of change in a curvature of the virtual ellipse corresponding to the outside of the cover window is different from a degree of change in a curvature of the virtual ellipse corresponding to the inside of the cover window.

3. The display device of claim 1, wherein a plane coupling a center of the virtual ellipse corresponding to the outside of the cover window and a center of the virtual ellipse corresponding to the inside of the cover window together is orthogonal to a flat surface at the center of the cover window.

4. The display device of claim 1, wherein the cover window comprises a glass, poly(methylmethacrylate) (PMMA), or polycarbonate (PC) material.

5. The display device of claim 1, wherein an end of the outer block of the cover window comprises an inclined plane inclined relative to a flat surface at the center of the cover window.

6. The display device of claim 5, wherein the inclined plane is inclined from a first end of the outside of the cover window, crossing a long axis of the virtual ellipse corresponding to the outside of the cover window, toward the inside of the cover window.

7. The display device of claim 6, wherein the inclined plane has a slope such that the cover window covers an outer block of the display panel.

8. The display device of claim 5, wherein a back cover is attached to the inclined plane.

9. The display device of claim 1, wherein one of the outer blocks of the cover window has a portion extending between the outside and the inside of the cover window in such a way as to be orthogonal to a flat surface at the center of the cover window.

10. The display device of claim 9, wherein a back cover is attached at an inside of the cover window and at an end of one of the outer blocks of the cover window at a portion in which the display panel is not formed.

11. The display device of claim 9, wherein a back cover is attached to an inside of one of the outer blocks of the cover window at a portion in which the display panel is not formed.

12. The display device of claim 1, wherein the display panel has curves formed in outer blocks of the display panel along the inside of the cover window corresponding to a shape of the cover window.

13. The display device of claim 1, wherein the display panel comprises an organic light-emitting display element.

14. The display device of claim 1, wherein the display panel has a flexible characteristic.

15. A display device comprising:
a cover window having curves at one or more outer blocks of the cover window, an outside and an inside of the cover window each having a shape of a quadrisected arc of a virtual ellipse and together forming a lens, and a thickness of the cover window at one of the outer blocks of the cover window being thicker than a thickness of the cover window at a center of the cover window; and
a display panel attached to the inside of the cover window, wherein an angle formed by a plane, coupling a first end crossing a long axis of the virtual ellipse corresponding to the outside of the cover window and a second end crossing a long axis of the virtual ellipse corresponding to the inside of the cover window together, and a flat surface at the center of the cover window is a refractive threshold angle calculated according to the following equation:

$$\sin\theta = \frac{n_2}{n_1},$$

wherein $\theta$ is the refractive threshold angle, $n_1$ is a refractive index of a material of the cover window, and $n_2$ is a refractive index of air, and
wherein the cover window comprises a glass, poly(methylmethacrylate) (PMMA), or polycarbonate (PC) material.

16. The display device of claim 15, wherein a display area of the display panel extends to the second end.

* * * * *